(12) United States Patent
Jung

(10) Patent No.: US 10,707,838 B2
(45) Date of Patent: Jul. 7, 2020

(54) INPUT AND OUTPUT CIRCUITS AND INTEGRATED CIRCUITS USING THE SAME

(71) Applicant: SK hynix Inc., Icheon-si, Gyeonggi-do (KR)

(72) Inventor: Ho Don Jung, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 553 days.

(21) Appl. No.: 15/175,280

(22) Filed: Jun. 7, 2016

(65) Prior Publication Data

US 2017/0244389 A1 Aug. 24, 2017

(30) Foreign Application Priority Data

Feb. 22, 2016 (KR) .................. 10-2016-0020842

(51) Int. Cl.
*H03K 3/01* (2006.01)
*H03K 3/356* (2006.01)

(52) U.S. Cl.
CPC ......... *H03K 3/01* (2013.01); *H03K 3/356113* (2013.01)

(58) Field of Classification Search
CPC .... H03K 3/01; H03K 3/356113; H03K 5/133; H03K 19/00384; H03K 19/17764; H03K 2005/00215; H03K 5/06; H03K 5/134; H03K 5/14; G01R 31/2642; G01R 31/30; G01R 31/31725; G01R 31/2628; G01R 31/2817; G01R 31/2855; G01R 31/2856; G01R 31/2858; G01R 31/2874; G01R 31/2882; G01R 31/3016; G01R 31/3177; G01R 31/318572; G01R 31/318594; G01R 31/31937; G01R 31/0315
See application file for complete search history.

(56) References Cited

U.S. PATENT DOCUMENTS

| 5,400,344 A | * | 3/1995 | Mori ................. G01R 31/2853 365/201 |
| 6,442,716 B1 | * | 8/2002 | Kim ..................... G11C 7/1051 365/201 |
| 6,731,179 B2 | | 5/2004 | Abadeer et al. |
| 6,924,669 B2 | * | 8/2005 | Itoh ...................... H03K 17/167 326/27 |
| 2009/0189703 A1 | * | 7/2009 | Chuang ................ H03K 3/0315 331/57 |
| 2013/0015876 A1 | * | 1/2013 | Lai ................... G01R 31/31924 324/762.01 |

FOREIGN PATENT DOCUMENTS

KR 1019980026621 A 7/1998

\* cited by examiner

*Primary Examiner* — Lee E Rodak
(74) *Attorney, Agent, or Firm* — William Park & Associates Ltd.

(57) ABSTRACT

An input/output (I/O) circuit may be provided. The I/O circuit may include an input control circuit and an output control circuit. The input control circuit may be configured to apply a stress to a transmission path based on an input signal while in a test mode and buffer the input signal using a drivability changed by the stress applied to the transmission path to generate first and second transmission signals while in a normal mode after the test mode. The output control circuit may be configured to drive and output an output signal according to the first and second transmission signals based on a test mode signal.

10 Claims, 8 Drawing Sheets

US 10,707,838 B2

1

INPUT AND OUTPUT CIRCUITS AND INTEGRATED CIRCUITS USING THE SAME

CROSS-REFERENCE TO RELATED APPLICATIONS

The present application claims priority under 35 U.S.C 119(a) to Korean Patent Application No. 10-2016-0020842, filed on Feb. 22, 2016, which is incorporated herein by reference in its entirety.

BACKGROUND

1. Technical Field

Embodiments of the present disclosure generally relate to input and output circuits and integrated circuits using the same.

2. Related Art

As the operation time of semiconductor devices increases, performance and reliability of the semiconductor devices may be degraded due to electrical and temperature stresses. Particularly, characteristics of PMOS transistors included in the semiconductor devices may be degraded due to a negative bias temperature instability (NBTI) phenomenon. Additionally, the degradation of the characteristics of the PMOS transistors may cause performance degradation of the semiconductor devices.

The NBTI phenomenon means that a threshold voltage (an absolute value) of a PMOS transistor increases to reduce an on-current and a switching speed of the PMOS transistor after the PMOS transistor is turned on for a long time. That is, if the PMOS transistor is exposed to a condition causing the NBTI phenomenon, operation timing of the PMOS transistor may change. This may lead to timing errors of internal circuits of the semiconductor device. These timing errors may cause degradation of the performance and reliability of the semiconductor device.

SUMMARY

According to an embodiment, an input/output (I/O) circuit may be provided. The I/O circuit may include an input control circuit and an output control circuit. The input control circuit may be configured to apply a stress to a transmission path based on an input signal while in a test mode and buffer the input signal using a drivability changed by the stress applied to the transmission path to generate first and second transmission signals while in a normal mode after the test mode. The output control circuit may be configured to drive and output an output signal according to the first and second transmission signals based on a test mode signal.

According to an embodiment, an integrated circuit. The integrated circuit may include a transmission device and a reception device. The transmission device may be configured to apply a stress to first and second transmission paths based on an input signal while in a test mode and buffer the input signal using a drivability changed by the stress applied to the first and second transmission paths to generate an output signal while in a normal mode after the test mode. The reception device may be configured to apply a stress to third and fourth transmission paths based on the output signal while in the test mode and buffer the output signal

2 using a drivability changed by the stress applied to the third and fourth transmission paths to generate an internal signal while in the normal mode.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to input/output circuits preventing a pulse width of an output signal from changing due to NBTI phenomenon and integrated circuits using the same.

Figure 1:
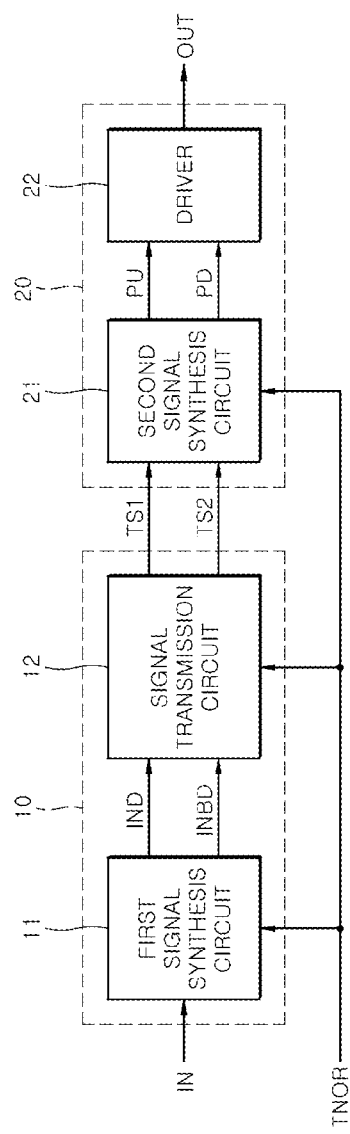
FIG. 1 is a block diagram illustrating a representation of an example of a configuration of an input and output (input/output) circuit according to an embodiment of the present disclosure.

Referring to FIG. 1, an input/output (I/O) circuit according to an embodiment of the present disclosure may include an input control circuit 10 and an output control circuit 20.

The input control circuit 10 may include a first signal synthesis circuit 11 and a signal transmission circuit 12.

If an input signal IN has a first logic level (e.g., a logic low level) in a test mode, the first signal synthesis circuit 11 may invert the input signal IN using a drivability changed by a stress to generate an inversely delayed input signal INBD having a second logic level (e.g., a logic high level). The first signal synthesis circuit 11 may output the input signal IN as a delayed input signal IND in a normal mode. The first signal synthesis circuit 11 may synthesize the delayed input signal IND and the inversely delayed input signal INBD in the normal mode.

A test mode signal TNOR may be set as a signal which is enabled to a logic high level in the test mode. A logic level of the enabled test mode signal TNOR may be set to be different according to the embodiments. The test mode may be set to be performed during an initial operation of a semiconductor device or an integrated circuit including the I/O circuit. For example, the test mode may be a burn-in test mode in which stress is applied to a circuit included in the semiconductor device.

The signal transmission circuit 12 may buffer the delayed input signal IND using a drivability changed by a stress applied to a transmission path to generate a first transmission signal TS1 in the test mode. The signal transmission circuit 12 may buffer the inversely delayed input signal INBD using the drivability changed by the stress applied to the transmission path to generate a second transmission signal TS2 in the test mode. The stress may be applied to the transmission path in the test mode, if the input signal IN has the first logic level (i.e., a logic low level). A case that the stress is applied may mean a case that a drivability for pulling up an output signal OUT of the I/O circuit using a power supply voltage VDD is changed in the test mode. Here, a case that the drivability for pulling up the output signal OUT is changed may mean a case that characteristics of PMOS transistors included in the transmission path are degraded due to a negative bias temperature instability (NBTI) phenomenon.

That is, the input control circuit 10 may apply the stress to the transmission path in response to the input signal IN in the test mode and may buffer the input signal IN using the drivability changed by the stress applied to the transmission path to generate the first and second transmission signals TS1 and TS2 in the normal mode after the test mode.

The output control circuit 20 may include a second signal synthesis circuit 21 and a driver 22.

The second signal synthesis circuit 21 may output the first transmission signal TS1 as a pull-up signal PU and may output the second transmission signal TS2 as a pull-down signal PD in the normal mode. The second signal synthesis circuit 21 may synthesize the pull-up signal PU and the pull-down signal PD in the test mode. An operation of synthesizing the pull-up signal PU and the pull-down signal PD in the test mode will be described later.

The driver 22 may drive and output the output signal OUT in response to the pull-up signal PU and the pull-down signal PD.

That is, the output control circuit 20 may drive and output the output signal OUT in response to the test mode signal TNOR, the first transmission signal TS1, and the second transmission signal TS2.

Figure 2:
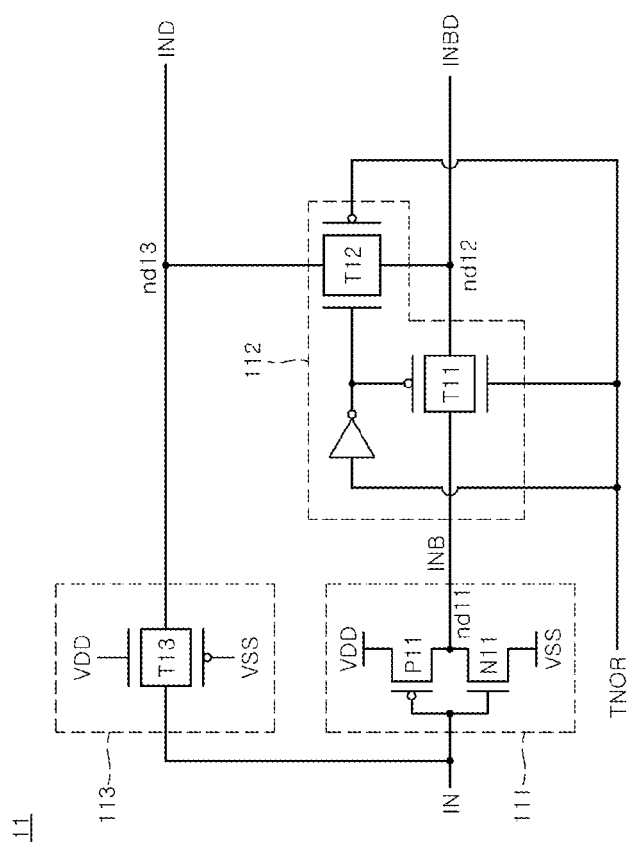
FIG. 2 is a circuit diagram of a representation of an example of a first signal synthesis circuit included in the input/output circuit of FIG. 1.

Referring to FIG. 2, the first signal synthesis circuit 11 may include a buffer 111, a first transmission circuit 112, and a second transmission circuit 113.

The buffer 111 may include a pull-up element P11 realized using a PMOS transistor which is coupled between a power supply voltage VDD terminal and a node nd11 and which is turned on if the input signal IN has the first logic level (i.e., a logic low level) and a pull-down element N11 realized using an NMOS transistor which is coupled between the node nd11 and a ground voltage VSS terminal and which is turned on if the input signal IN has the second logic level (i.e., a logic high level). The buffer 111 may pullup a level of the node nd11 to generate an inverted input signal INB having a logic high level if the input signal IN has the first logic level (i.e., a logic low level). The buffer 111 may pulldown a level of the node nd11 to generate the inverted input signal INB having a logic low level if the input signal IN has the second logic level (i.e., a logic high level). The buffer 111 may inversely buffer the input signal IN to generate the inverted input signal INB. If the input signal IN has the first logic level (i.e., a logic low level), characteristics of the pull-up element P11 may be degraded by the NBTI phenomenon to cause a stress applied to the buffer 111.

The first transmission circuit 112 may transmit the inverted input signal INB to a node nd12 to generate the inversely delayed input signal INBD or may connect the node nd12 to a node nd13 through which the delayed input signal IND is output, according to the test mode signal TNOR. The first transmission circuit 112 may output the inverted input signal INB to the node nd12 through a transfer gate T11 which is turned on if the test mode signal TNOR has a logic high level, and the inverted input signal INB on the node nd12 may be outputted as the inversely delayed input signal INBD. The first transmission circuit 112 may connect the node nd12 to the node nd13 through a transfer gate T12 which is turned on if the test mode signal TNOR has a logic low level, to thus synthesize the delayed input signal IND and the inversely delayed input signal INBD.

The second transmission circuit 113 may output the input signal IN as the delayed input signal IND. The second transmission circuit 113 may transmit the input signal IN to the node nd13 through a transfer gate T13 which is turned on in response to the power supply voltage VDD and the ground voltage VSS, and the input signal IN on the node nd13 may be outputted as the delayed input signal IND.

Figure 3:
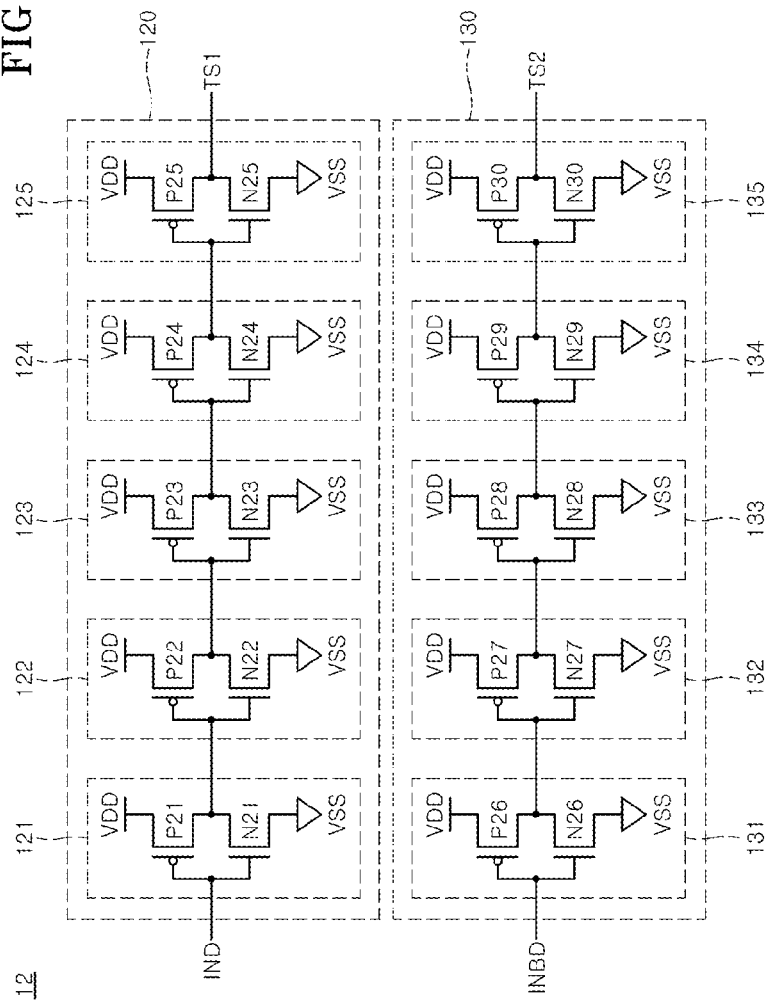
FIG. 3 is a circuit diagram illustrating a representation of an example of a signal transmission circuit included in the input/output circuit of FIG. 1.

Referring to FIG. 3, the signal transmission circuit 12 may include a first transmission path 120 and a second transmission path 130.

The first transmission path 120 may include a first drive circuit 121, a second drive circuit 122, a third drive circuit 123, a fourth drive circuit 124, and a fifth drive circuit 125. In an embodiment, for example, the drive circuits of the first transmission path 120 may be cascaded. In an embodiment, for example, the drive circuits may be realized using an inverter.

In an embodiment, for example, the first drive circuit 121 may be realized using a PMOS transistor P21 and an NMOS transistor N21 which are connected in series between the power supply voltage VDD terminal and the ground voltage VSS terminal and may inversely buffer the delayed input signal IND to output the inversely buffered signal.

In an embodiment, for example, the second drive circuit 122 may be realized using a PMOS transistor P22 and an NMOS transistor N22 which are connected in series between the power supply voltage VDD terminal and the ground voltage VSS terminal and may inversely buffer an output signal of the first drive circuit 121 to output the inversely buffered signal.

In an embodiment, for example, the third drive circuit 123 may be realized using a PMOS transistor P23 and an NMOS transistor N23 which are connected in series between the power supply voltage VDD terminal and the ground voltage VSS terminal and may inversely buffer an output signal of the second drive circuit 122 to output the inversely buffered signal.

In an embodiment, for example, the fourth drive circuit 124 may be realized using a PMOS transistor P24 and an NMOS transistor N24 which are connected in series between the power supply voltage VDD terminal and the ground voltage VSS terminal and may inversely buffer an output signal of the third drive circuit 123 to output the inversely buffered signal.

In an embodiment, for example, the fifth drive circuit 125 may be realized using a PMOS transistor P25 and an NMOS transistor N25 which are connected in series between the power supply voltage VDD terminal and the ground voltage VSS terminal and may inversely buffer an output signal of the fourth drive circuit 124 to output the inversely buffered signal as the first transmission signal TS1.

That is, the first transmission path 120 may drive and output the first transmission signal TS1 using a drivability changed in the test mode in response to the delayed input signal IND. The number of the drive circuits included in the first transmission path 120 may be set to be different according to the embodiments.

For example, a drivability of the first transmission path 120 changed by the stress applied to the first transmission path 120 in the test mode will be described hereinafter.

If the delayed input signal IND generated from the input signal IN has the first logic level (i.e., a logic low level) in the test mode, the PMOS transistor P21 of the first drive circuit 121, the NMOS transistor N22 of the second drive circuit 122, the PMOS transistor P23 of the third drive circuit 123, the NMOS transistor N24 of the fourth drive circuit 124, and the PMOS transistor P25 of the fifth drive circuit 125 may be turned on. Thus, the first transmission signal TS1 may be driven to a logic high level. In such a case, the PMOS transistor P21 of the first drive circuit 121, the PMOS transistor P23 of the third drive circuit 123, and the PMOS transistor P25 of the fifth drive circuit 125 may be degraded by a stress which is due to the aforementioned negative bias temperature instability (NBTI) phenomenon. That is, characteristics of the PMOS transistors P21, P23 and P25 may be degraded to reduce the drivability of the first transmission path 120.

The second transmission path 130 may include a sixth drive circuit 131, a seventh drive circuit 132, an eighth drive circuit 133, a ninth drive circuit 134, and a tenth drive circuit 135. In an embodiment, for example, the drive circuits of the first transmission path 120 may be cascaded. In an embodiment, for example, the drive circuits may be realized using an inverter.

In an embodiment, for example, the sixth drive circuit 131 may be realized using a PMOS transistor P26 and an NMOS transistor N26 which are connected in series between the power supply voltage VDD terminal and the ground voltage VSS terminal and may inversely buffer the inversely delayed input signal INBD to output the inversely buffered signal.

In an embodiment, for example, the seventh drive circuit 132 may be realized using a PMOS transistor P27 and an NMOS transistor N27 which are connected in series between the power supply voltage VDD terminal and the ground voltage VSS terminal and may inversely buffer an output signal of the sixth drive circuit 131 to output the inversely buffered signal.

In an embodiment, for example, the eighth drive circuit 133 may be realized using a PMOS transistor P28 and an NMOS transistor N28 which are connected in series between the power supply voltage VDD terminal and the ground voltage VSS terminal and may inversely buffer an output signal of the seventh drive circuit 132 to output the inversely buffered signal.

In an embodiment, for example, the ninth drive circuit 134 may be realized using a PMOS transistor P29 and an NMOS transistor N29 which are connected in series between the power supply voltage VDD terminal and the ground voltage VSS terminal and may inversely buffer an output signal of the eighth drive circuit 133 to output the inversely buffered signal.

In an embodiment, for example, the tenth drive circuit 135 may be realized using a PMOS transistor P30 and an NMOS transistor N30 which are connected in series between the power supply voltage VDD terminal and the ground voltage VSS terminal and may inversely buffer an output signal of the ninth drive circuit 134 to output the inversely buffered signal as the second transmission signal TS2.

That is, the second transmission path 130 may drive and output the second transmission signal TS2 using a drivability changed in the test mode in response to the inversely delayed input signal INBD. The number of the drive circuits included in the second transmission path 130 may be set to be different according to the embodiments.

For example, a drivability of the second transmission path 130 changed by the stress applied to the second transmission path 130 in the test mode will be described hereinafter.

If the inversely delayed input signal INBD generated by inversely buffering the input signal IN has the second logic level (i.e., a logic high level) in the test mode, the NMOS transistor N26 of the sixth drive circuit 131, the PMOS transistor P27 of the seventh drive circuit 132, the NMOS transistor N28 of the eighth drive circuit 133, the PMOS transistor P29 of the ninth drive circuit 134, and the NMOS transistor N30 of the tenth drive circuit 135 may be turned on. Thus, the second transmission signal TS2 may be driven to a logic low level. In such a case, the PMOS transistor P27 of the seventh drive circuit 132 and the PMOS transistor P29 of the ninth drive circuit 134 may be degraded by a stress which is due to the aforementioned negative bias temperature instability (NBTI) phenomenon. That is, characteristics of the PMOS transistors P27 and P29 may be degraded to reduce the drivability of the second transmission path 130.

Figure 4:
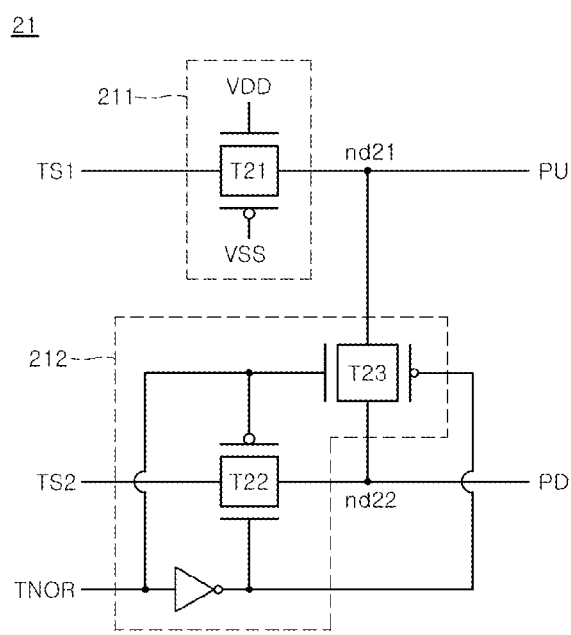
FIG. 4 is a circuit diagram of a representation of an example of a second signal synthesis circuit included in the input/output circuit of FIG. 1.

Referring to FIG. 4, the second signal synthesis circuit 21 may include a third transmission circuit 211 and a fourth transmission circuit 212.

The third transmission circuit 211 may output the first transmission signal TS1 as the pull-up signal PU. The third transmission circuit 211 may output the first transmission signal TS1 to a node nd21 through a transfer gate T21 which is turned on in response to the power supply voltage VDD and the ground voltage VSS, and the first transmission signal TS1 on the node nd21 may act as the pull-up signal PU.

The fourth transmission circuit 212 may output the second transmission signal TS2 to a node nd22 to generate the pull-down signal PD or may connect the node nd22 to the node nd21, in response to the test mode signal TNOR. The fourth transmission circuit 212 may connect the node nd22 to the node 21 through a transfer gate T23, which is turned on if the test mode signal TNOR has a logic high level, to synthesize the pull-up signal PU and the pull-down signal PD. If the test mode signal TNOR has a logic low level, the fourth transmission circuit 212 may output the second transmission signal TS2 to the node nd22 to generate the pull-down signal PD.

That is, the second signal synthesis circuit 21 may output the first transmission signal TS1 as the pull-up signal PU through the node nd21, may connect the node nd22 to the node nd21 in the test mode, and may output the second transmission signal TS2 as the pull-down signal PD through the node nd22 in the normal mode.

Figure 5:
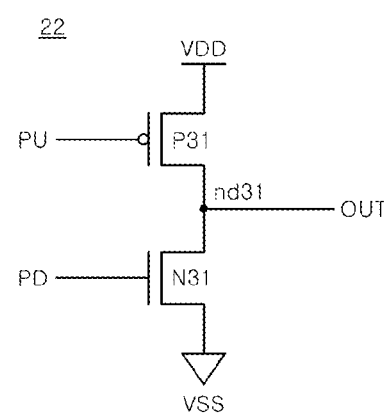
FIG. 5 is a circuit diagram of a representation of an example of a driver included in the input/output circuit of FIG. 1.

Referring to FIG. 5, the driver 22 may include a pull-up element P31 and a pull-down element N31.

The pull-up element P31 may be coupled between the power supply voltage VDD terminal and a node nd31 and may be turned on to pull up a level of the node nd31 to the power supply voltage VDD if the pull-up signal PU has a logic low level. The pull-up element P31 may drive the output signal OUT to a logic high level if the pull-up signal PU has a logic low level.

The pull-down element N31 may be coupled between the node nd31 and the ground voltage VSS terminal and may be turned on to pull down a level of the node nd31 to the ground voltage VSS if the pull-down signal PD has a logic high level. The pull-down element N31 may drive the output signal OUT to a logic low level if the pull-down signal PD has a logic high level.

That is, the driver 22 may drive and output the output signal OUT in response to the pull-up signal PU and the pull-down signal PD.

Figure 6:
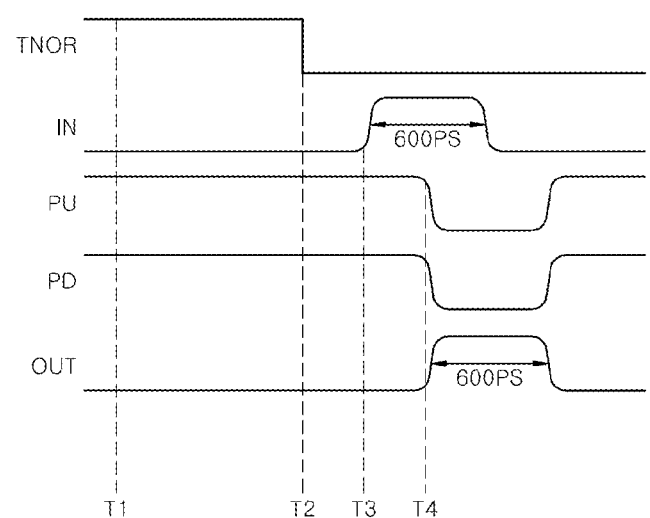
FIG. 6 is a timing diagram illustrating a representation of an example of an operation of an input/output circuit according to an embodiment of the present disclosure.

An operation of the I/O circuit having an aforementioned configuration will be described hereinafter with reference to FIG. 6 in conjunction with an example in which the output signal OUT is generated according to the input signal IN having a pulse width of about 600 picoseconds in the normal mode after a stress is applied to the transmission paths 120 and 130 in the test mode.

First, the I/O circuit according to an embodiment of the present disclosure may be set to enter the test mode at a point of time T1.

At the point of time T1, the I/O circuit may enter the test mode to generate the test mode signal TNOR having a logic high level.

Since the input signal IN has the first logic level (i.e., a logic low level), the buffer 111 may pull up the node nd11 using the pull-up element P11 realized by a PMOS transistor to generate the inverted input signal INB having a logic high level. In such a case, since the input signal IN has the first logic level (i.e., a logic low level), characteristics of the pull-up element P11 of the buffer 111 may be degraded by a stress which is due to the negative bias temperature instability (NBTI) phenomenon.

The first transmission circuit 112 may output the inverted input signal INB to the node nd12 to generate the inversely delayed input signal INBD having a logic high level, in response to the test mode signal TNOR.

The second transmission circuit 113 may output the input signal IN having the first logic level (i.e., a logic low level) as the delayed input signal IND.

The first transmission path 120 may drive the first transmission signal TS1 in response to the delayed input signal IND.

For example, since the delayed input signal IND has the first logic level (i.e., a logic low level), the PMOS transistor P21 of the first drive circuit 121, the NMOS transistor N22 of the second drive circuit 122, the PMOS transistor P23 of the third drive circuit 123, the NMOS transistor N24 of the fourth drive circuit 124, and the PMOS transistor P25 of the fifth drive circuit 125 may be turned on. Thus, the first transmission signal TS1 may be driven to a logic high level. In such a case, the PMOS transistor P21 of the first drive circuit 121, the PMOS transistor P23 of the third drive circuit 123, and the PMOS transistor P25 of the fifth drive circuit 125 may be degraded by a stress which is due to the aforementioned negative bias temperature instability (NBTI) phenomenon.

The second transmission path 130 may drive the second transmission signal TS2 in response to the inversely delayed input signal INBD.

For example, since the inversely delayed input signal INBD has the second logic level (i.e., a logic high level), the NMOS transistor N26 of the sixth drive circuit 131, the PMOS transistor P27 of the seventh drive circuit 132, the NMOS transistor N28 of the eighth drive circuit 133, the PMOS transistor P29 of the ninth drive circuit 134, and the NMOS transistor N30 of the tenth drive circuit 135 may be turned on. Thus, the second transmission signal TS2 may be driven to a logic low level. In such a case, the PMOS transistor P27 of the seventh drive circuit 132 and the PMOS transistor P29 of the ninth drive circuit 134 may be degraded by a stress which is due to the aforementioned negative bias temperature instability (NBTI) phenomenon.

The third transmission circuit 211 may output the first transmission signal TS1 as the pull-up signal PU.

Since the transfer gate T23 electrically connects the node nd22 to the node nd21 in response to the test mode signal TNOR having a logic high level, the fourth transmission circuit 212 may synthesize the pull-up signal PU and the pull-down signal PD. In such a case, the fourth transmission circuit 212 may not output the second transmission signal TS2 as the pull-down signal PD because the transfer gate T22 is turned off.

The driver 22 may drive the output signal OUT to a logic low level in response to the pull-up signal PU and the pull-down signal PD.

Next, the I/O circuit according to an embodiment of the present disclosure may be set to enter the normal mode at a point of time T2.

At the point of time T2, the I/O circuit may enter the normal mode to generate the test mode signal TNOR having a logic low level.

At a point of time T3, the input signal IN having the second logic level (i.e., a logic high level) may be inputted to the I/O circuit. Thus, the pull-down element N11 of the buffer 111, which is realized using an NMOS transistor, may pull down the node nd11 to generate the inverted input signal INB having a logic low level. The input signal IN may be set to have a pulse width of about 600 picoseconds.

The second transmission circuit 113 may output the input signal IN having the second logic level (i.e., a logic high level) as the delayed input signal IND.

The first transmission circuit 112 may connect the node nd12 to the node nd13 in response to the test mode signal TNOR. That is, the first transmission circuit 112 may synthesize the delayed input signal IND and the inversely delayed input signal INBD to generate the inversely delayed input signal INBD having the second logic level (i.e., a logic high level).

At a point of time T4, the first transmission path 120 drive the first transmission signal TS1 to a logic low level in response to the delayed input signal IND.

For example, since the delayed input signal IND has the second logic level (i.e., a logic high level), the NMOS transistor N21 of the first drive circuit 121, the PMOS transistor P22 of the second drive circuit 122, the NMOS transistor N23 of the third drive circuit 123, the PMOS transistor P24 of the fourth drive circuit 124, and the NMOS transistor N25 of the fifth drive circuit 125 may be turned on. Thus, the first transmission signal TS1 may be driven to a logic low level. In such a case, the PMOS transistor P21 of the first drive circuit 121, the PMOS transistor P23 of the third drive circuit 123, and the PMOS transistor P25 of the fifth drive circuit 125 may have poor characteristics which are degraded by the stress which is due to the aforementioned negative bias temperature instability (NBTI) phenomenon in the test mode. Accordingly, in the normal mode, the first transmission signal TS1 may be generated through the PMOS transistors P22 and P24 which are not degraded.

The second transmission path 130 may drive the second transmission signal TS2 in response to the inversely delayed input signal INBD.

For example, since the inversely delayed input signal INBD has the second logic level (i.e., a logic high level), the NMOS transistor N26 of the sixth drive circuit 131, the PMOS transistor P27 of the second drive circuit 132, the NMOS transistor N28 of the eighth drive circuit 133, the PMOS transistor P29 of the ninth drive circuit 134, and the NMOS transistor N30 of the tenth drive circuit 135 may be turned on. Thus, the second transmission signal TS2 may be driven to a logic low level. In such a case, the PMOS transistor P27 of the seventh drive circuit 132 and the PMOS transistor P29 of the ninth drive circuit 134 may have poor characteristics which are degraded by the stress which is due to the aforementioned negative bias temperature instability (NBTI) phenomenon in the test mode. Accordingly, the second transmission signal TS2 may be generated through the degraded transistors P27 and P29.

The third transmission circuit 211 may output the first transmission signal TS1 as the pull-up signal PU.

The fourth transmission circuit 212 may output the second transmission signal TS2 as the pull-down signal PD through the transfer gate T22 which is turned on in response to the test mode signal TNOR. At this time, since the transfer gate T23 is turned off, the fourth transmission circuit 212 does not connect the node nd22 to the node nd21.

The driver 22 may drive the output signal OUT to a logic high level in response to the pull-up signal PU having a logic low level and the pull-down signal PD having a logic low level. At this time, since the pull-up signal PU pulling up the output signal OUT is generated through the PMOS transistors P22 and P24 which are not degraded in the test mode, the output signal OUT may be generated to have substantially the same pulse width (i.e., 600 picoseconds) as the input signal IN.

The I/O circuit according to an embodiment of the present disclosure may drive an output signal using a signal which is generated through transistors which are not degraded in two different transmission paths that the NBTI deterioration occurs complementarily. Accordingly, it may be possible to prevent a pulse width of the output signal from changing due to the NBTI phenomenon.

Figure 7:
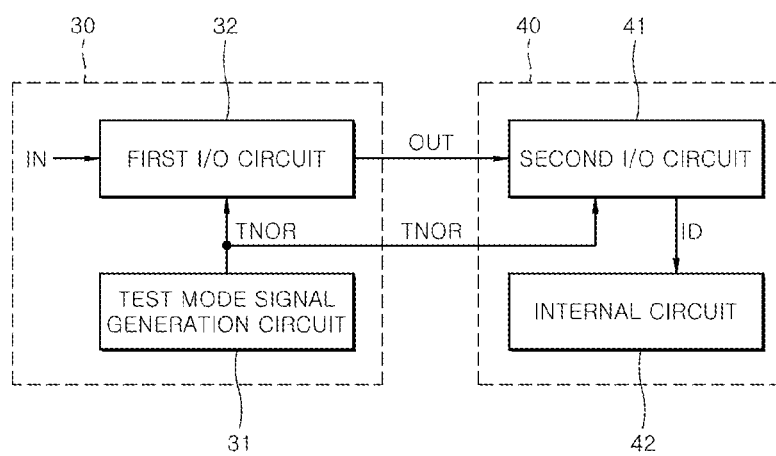
FIG. 7 is a block diagram illustrating a representation of an example of a configuration of an integrated circuit according to an embodiment of the present disclosure.

FIG. 7 is a block diagram illustrating a configuration of an integrated circuit according to an embodiment of the present disclosure.

Referring to FIG. 7, the integrated circuit may include a transmission device 30 and a reception device 40.

The transmission device 30 may include a test mode signal generation circuit 31 and a first I/O circuit 32.

The test mode signal generation circuit 31 may generate a test mode signal TNOR which is enabled to have a logic high level in a test mode. A logic level of the enabled test mode signal TNOR may be set to be different according to the embodiments.

The first I/O circuit 32 may apply a stress to a transmission path included therein in response to an input signal IN in the test mode and may buffer the input signal IN using a drivability which is changed by the stress applied to the transmission path to generate an output signal OUT in a normal mode after the test mode. The first I/O circuit 32 may have the same configuration as the I/O circuit illustrated in FIG. 1 and may perform the same operation as the I/O circuit illustrated in FIG. 1. Accordingly, a detailed description of the first I/O circuit 32 will be omitted hereinafter.

The reception device 40 may include a second I/O circuit 41 and an internal circuit 42.

The second I/O circuit 41 may apply a stress to a transmission path included therein in response to the output signal OUT in the test mode and may buffer the output signal OUT using a drivability which is changed by the stress applied to the transmission path to generate an internal signal ID in the normal mode after the test mode. The second I/O circuit 41 may have the same configuration as the I/O circuit illustrated in FIG. 1 except for the input and output signals and may perform the same operation as the I/O circuit illustrated in FIG. 1. Accordingly, a detailed description of the second I/O circuit 41 will be omitted hereinafter.

The internal circuit 42 may be driven in response to the internal signal ID. The internal circuit 42 may correspond to an internal circuit included in a semiconductor device.

An integrated circuit having an aforementioned configuration may operate according to an internal signal generated from an output signal that is generated by using transistors that are not degraded by a stress which is due to the NBTI phenomenon. Accordingly, it may be possible to prevent a pulse width of the internal signal from changing due to the NBTI phenomenon. As a result, the integrated circuit may perform a stable operation.

Figure 8:
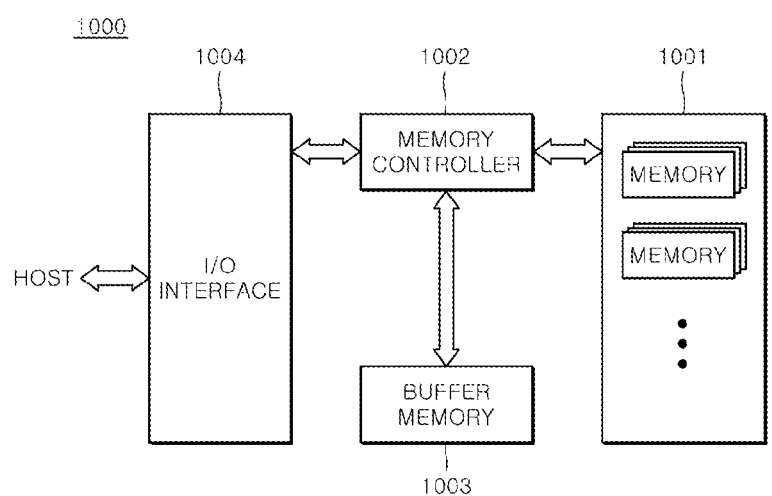
FIG. 8 is a block diagram illustrating a representation of an example of a configuration of an electronic system employing the input/output circuit or the integrated circuit illustrated in FIG. 1 to FIG. 7.

The integrated circuit described with reference to FIGS. 1 to 7 may be applied to an electronic system that includes a memory system, a graphic system, a computing system, a mobile system, or the like. For example, as illustrated in FIG. 8, an electronic system 1000 according an embodiment of the present disclosure may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 8 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

The transmission device and the reception device included in the integrated circuit according to an embodiment may be coupled between the host and the I/O interface 1004 which are illustrated in FIG. 8, may be coupled between the I/O interface 1004 and the memory controller 1002 which are illustrated in FIG. 8, may be coupled between the memory controller 1002 and the buffer memory 1003 which are illustrated in FIG. 8, or may be coupled between the memory controller 1002 and the data storage circuit 1001 which are illustrated in FIG. 8.

What is claimed is:

1. An input/output (I/O) circuit comprising:
    an input control circuit configured to apply a stress to a plurality transistors for a transmission path based on an input signal while in a test mode and configured to buffer the input signal using a drivability which is changed by the stress applied to the plurality of transistors for the transmission path to generate first and second transmission signals while in a normal mode after the test mode;
    a first signal synthesis circuit configured to drive a first node using a drivability changed by the stress to generate an inversely delayed input signal having a second logic level while in a test mode if the input signal has a first logic level, configured to output the input signal as a delayed input signal through a second node while in the normal mode, and configured to connect the first node to the second node while in the normal mode;
    a signal transmission circuit configured to buffer the delayed input signal using the drivability changed by the stress applied while in the test mode to generate the first transmission signal and configured to buffer the inversely delayed input signal using the drivability changed by the stress applied while in the test mode to generate the second transmission signal; and
    an output control circuit configured to drive and output an output signal according to the first and second transmission signals based on a test mode signal.

2. The circuit of claim 1, wherein the stress is applied while in the test mode if the input signal has a first logic level.

3. The circuit of claim 1, wherein, when the stress is applied to the transmission path, a drivability of the output control circuit for pulling up the output signal to a power supply voltage is changed while in the test mode.

4. The circuit of claim 1, wherein the first signal synthesis circuit includes;
    a buffer configured to inversely buffer the input signal to generate an inverted input signal;
    a first transmission circuit configured to output the inverted input signal to the first node to generate the inversely delayed input signal or configured to connect the first node to the second node, based on the test mode signal; and
    a second transmission circuit configured to output the input signal to the second node to generate the delayed input signal.

5. The circuit of claim 1, wherein the signal transmission circuit includes:
    a first transmission path configured to drive the first transmission signal using the changed drivability based on the delayed input signal; and
    a second transmission path configured to drive the second transmission signal using the changed drivability based on the inversely delayed input signal.

6. The circuit of claim 5,
    wherein each of the first and second transmission paths is configured to include a plurality of drive circuits that are cascaded; and
    wherein each of the plurality of drive circuits is realized using an inverter.

7. The circuit of claim 5,
    wherein each of the first and second transmission paths is configured to include a plurality of drive circuits coupled in series;
    wherein each of the plurality of drive circuits includes a PMOS transistor and a NMOS transistor connected in series between a power supply and a ground voltage;
    wherein a first plurality of PMOS and NMOS transistors are used to generate the first and second transmission signals while in the test mode; and
    wherein a second plurality of PMOS and NMOS transistors different from the first plurality of PMOS and NMOS transistors are used to generate the first and second transmission signals while in the normal mode.

8. The circuit of claim 5,
    wherein each of the first and second transmission paths is configured to include a plurality of drive circuits coupled in series, and
    wherein each of the drive circuits is configured to inversely buffer a received signal and output an inversely buffered signal.

9. The circuit of claim 1, wherein the output control circuit includes:
    a second signal synthesis circuit configured to output the first transmission signal as a pull-up signal through a third node, configured to connect the third node to a fourth node while in the test mode, and configured to output the second transmission signal as a pull-down signal through the fourth node while in the normal mode; and
    a driver configured to drive the output signal based on the pull-up signal and the pull-down signal.

10. The circuit of claim 9, wherein the second signal synthesis circuit includes:
    a third transmission circuit configured to output the first transmission signal to the third node to generate the pull-up signal; and
    a fourth transmission circuit configured to output the second transmission signal to the fourth node to generate the pull-down signal or configured to connect the third node to the fourth node, based on the test mode signal.

* * * * *